US005485341A

United States Patent [19]
Okado et al.

[11] Patent Number: 5,485,341
[45] Date of Patent: Jan. 16, 1996

[54] POWER TRANSISTOR OVERCURRENT PROTECTION CIRCUIT

[75] Inventors: Chihiro Okado; Makoto Hideshima, both of Tokyo, Japan

[73] Assignee: Kabushiki Kaisha Toshiba, Kawasaki, Japan

[21] Appl. No.: 121,641

[22] Filed: Sep. 16, 1993

[30] Foreign Application Priority Data

Sep. 21, 1992 [JP] Japan .................................. 4-250308
Apr. 9, 1993 [JP] Japan .................................. 5-082332

[51] Int. Cl.⁶ .................................................. H02H 3/093
[52] U.S. Cl. .............................. 361/98; 361/83; 361/94; 361/79; 361/86; 361/87
[58] Field of Search .......................... 361/88, 89, 93, 361/94, 98, 100, 101, 78–79, 86–87, 83

[56] References Cited

U.S. PATENT DOCUMENTS

| | | |
|---|---|---|
| 4,321,648 | 3/1982 | Kaplan . |
| 4,623,950 | 11/1986 | Palara et al. ............................ 361/79 |
| 4,680,664 | 7/1987 | Leuthen . |
| 4,721,869 | 1/1988 | Okado . |
| 5,200,878 | 4/1993 | Sasagawa et al. ...................... 361/93 |

FOREIGN PATENT DOCUMENTS

| | | |
|---|---|---|
| 0384937 | 9/1990 | European Pat. Off. . |
| 0467681 | 1/1992 | European Pat. Off. . |
| 3003123 | 8/1980 | Germany . |
| 3204338 | 1/1983 | Germany . |
| 222740 | 5/1985 | Germany . |
| 61-251323 | 11/1986 | Japan . |
| 2138644 | 10/1984 | United Kingdom . |

*Primary Examiner*—A. D. Pellinen
*Assistant Examiner*—Michael J. Sherry
*Attorney, Agent, or Firm*—Oblon, Spivak, McClelland, Maier & Neustadt

[57] ABSTRACT

An overcurrent protection circuit for a power transistor for generating a main current in response to a gate drive voltage generated by a gate circuit. The overcurrent protection circuit includes a current detection circuit for detecting the main current flowing in the power transistor to generate a detection voltage corresponding to the main current, and a level detection circuit connected to receive the detection voltage for generating a control current corresponding to a difference between the detection voltage and a prescribed value when the detection voltage exceeds the prescribed value. The overcurrent protection circuit further includes a current control circuit connected to receive the control current for limiting the main current by regulating the gate drive voltage based on the control current, and a drive instruction control circuit connected to receive the control current for making the main current zero by controlling the gate drive voltage to an OFF condition based on the control current.

22 Claims, 13 Drawing Sheets

POWER TRANSISTOR OVERCURRENT PROTECTION CIRCUIT

BACKGROUND OF THE INVENTION

1. Field of the Invention

This invention relates to a power transistor overcurrent protection circuit, and more particularly to an overcurrent protection circuit of a power transistor of the voltage-driven type such as an IGBT or a MOSFET, that provides high speed current limiting of overcurrent produced by load short-circuiting etc., thereby providing breaking and protection in a safe operating range.

2. Description of the Related Art

IGBTs (insulated gate bipolar transistors) are widely known as voltage-driven power transistors. There has been a rapid expansion of the field of application of IGBTs on account of their low ON voltage, little drive power with MOS gate construction, and comparatively fast switching. ON voltage and switching speed characteristics are mutually antagonistic, and there is an unceasing research effort aimed at improving the trade-off between these so as to provide better device performance.

Characteristic C in FIG. 9a is the ON voltage characteristic of a third generation or later IGBT predicted from such studies. The ON voltage characteristic A of a first generation IGBT is shown for comparison. The characteristic B of the currently-used second generation IGBT is also shown. The collector current IC is expressed as a percentage, taking the rated current of the respective IGBT as 100.

As can be seen from these characteristics, when the collector-emitter voltage VCE rises under load short-circuit conditions, a collector current IC that is extremely larger than the rated current flows. In the case of a first-generation IGBT, this overcurrent is some 6 to 8 times the rated current, while in the case of a second-generation IGBT, it is some 10 to 12 times.

Third and subsequent generation IGBTs that are presently under study and have DRAM-class patterning of the am order, and other improvements. These result in an overcurrent characteristic C of some 15 to 20 times the rated current.

With such a large overcurrent, high speed current limiting and breaking are difficult, making overcurrent protection of the device difficult. Furthermore, with such a large overcurrent, even if high speed current limiting and circuit breaking are made, they result in excessive surge voltage, which makes safe protection difficult, and makes difficult overcurrent protection of the device.

Protection of conventional IGBTs on load short-circuiting is described below. FIG. 9b shows a typical main circuit layout using IGBTs. In this device, an electric motor 3 is driven by AC voltage converted from the DC voltage of a DC voltage source 1, using a bridge-type converter (inverter) 2 consisting of IGBTs 21 to 26. In such a device, when short-circuiting occurs across the terminals of the load (electric motor), a short-circuit current flows through the positive-side and the negative-side IGBTs. Short-circuit current can likewise arise if an ON signal (due to noise or incorrect operation) is input simultaneously to the positive-side and negative-side IGBTs in the same arm.

The amount of time that an IGBT can withstand such a short-circuit condition is 10 to 20 μs at a voltage of 80% of the device rated voltage in the case of present IGBTs. This implies that short-circuit protection must be provided such that overcurrent is detected and current limitation and circuit breaking are applied within 7.5 to 10 μs.

FIG. 10b is a characteristic graph of the short-circuit withstand capability of an IGBT showing the relationship between a collector current IC flowing on short-circuit under fixed collector-emitter voltage VCE and a withstand time tw. The test circuit thereof is also shown in FIG. 10a. As can be seen from this characteristic, collector current IC and withstand time tw have a practically constant-power relationship. Accordingly, the withstand time tw is shortened if collector current IC is increased by load short-circuiting etc, so a high speed protective action is required.

Various methods have accordingly been proposed of lengthening the apparent short-circuit withstand time by restricting the short-circuit current, utilizing the transistor action of the IGBT by lowering the gate voltage of the IGBT when overcurrent due to load short-circuiting etc is detected (Japanese patent disclosure (Kokai) No. P61-251323, Nov. 8, 1986).

The circuit shown in FIG. 11a was disclosed at a learned society (470, National Congress of the Institute of Electrical Engineers of Japan, 1992). A current sensing IGBT 4b is provided that detects the current of main IGBT 4a. When it exceeds a specific current the IGBT gate voltage is lowered by NLU (non latch-up) circuit 50, suppressing the short-circuit current.

One example of the NLU circuit 50 is shown in FIG. 11d, where 52 and 53 are resistors, and 54 is a MOSFET. In FIG. 11d, when the voltage drop of resistor 52 produced by the emitter current of current sensing IGBT 4b exceeds the gate threshold voltage of MOSFET 54, current flows to the drain of MOSFET 54 through a gate resistor 51 thereby lowering the gate voltage of the IGBT 4b. Alternatively, NLU circuit 50 could be a circuit as shown in FIG. 11e. In this circuit, MOSFET 54 is replaced by a bipolar transistor 55.

With such a circuit construction, the short-circuit current can be restricted as shown in FIG. 11c, and an apparent lengthening of the short-circuit withstand time can be achieved as shown in FIG. 11b by increasing the ON resistance of IGBT by lowering the gate voltage of the IGBT on overcurrent.

Although the short-circuit withstand capability of the IGBT is increased by the prior art method of FIG. 11, it is subject to the following problems. A separate circuit is required to turn off the signal for driving the IGBT bridge when a short-circuit fault is detected. Specifically, since it is designed that the short-circuit current is restricted to about 200%, detection of short-circuit fault is made difficult by the above-described overcurrent detection.

It is necessary to add a circuit to turn the drive signal off, by means of a separate short-circuit fault detection circuit or the like, which detects for example the situation that the voltage VCE of the IGBT remains high irrespective of application of an ON signal. This makes the circuitry further complicated.

Also, since the gate voltage is different even for the same drain current of FET 54 of FIG. 11d, depending on the value Rg of the gate resistance 51, the current limiting value ICL changes as shown in FIG. 12 depending on the magnitude of the value Rg.

Reduction in the variation of the current limiting value ICL can be achieved by increasing the gain of the drain current with respect to the current detection value of FIG. 11d. However, there is a limit to the extent to which this can be achieved, in that, if this gain is raised too far, MOSFET 54 performs a switching action rather than an analogue action, so that the gate of IGBT 4 drops to around zero and the current of the IGBT oscillates between the ON and OFF conditions. This results in the characteristic shown in FIG. 12.

A drawback is therefore that, if the value Rg is made small in order to speed up the switching of the IGBT, the short-circuit current limiting value ICL rises, diminishing the short-circuit withstand time.

A further problem is the generation of oscillation when IGBTs are connected in parallel. Specifically, if there is some difference in the operating levels of the current limiting functions of respective IGBTs, when the current limiting function of one IGBT is triggered, the current which is thus restricted will shift to another IGBT triggering the current limiting function of that IGBT. Repetition of this process results in a kind of oscillatory condition which risks damaging the IGBTs.

Also, although the operation of the IGBT current limiting function of the circuit shown in FIG. 11a is very fast, when an IGBT is used in antiparallel connection with a diode there are the following problems.

Specifically, as shown in the circuit of FIG. 13, discharge current iD flows to diode 21D from load inductor 3L, and when IGBT 24 turns on, as shown by the waveform diagram of FIG. 13, a peak current of about 1.5 to 2 times the load current iD flows in the rising portion of current IC of IGBT 24. The shaded portion of this current waveform is the recovery current of diode 21D and there is a characteristic that it increases as the withstand voltage of the diode is increased, furthermore it increases with rise of temperature. If the current limiting value is lower than this peak current, the turn-on loss of the IGBT is enormously increased. Therefore, assuming that discharge current iD is used up to the rated current of the IGBT, the peak current becomes about 200% of the rated current. Taking into account the need for a margin, the current limiting value must therefore be set at least 250% of the rated current. This results in the problem of the short-circuit withstand time being shortened.

Also, if the value Rg of gate resistor 51 is reduced in order to speed up the switching action, a current limiting value of about 500 to 600% of the rated current may be required. This leads to the drawback of protection harmonization being difficult to achieve.

A further problem is that, even in the system, as shown in FIG. 11, where the NLU circuit is provided, although the peak value of the current is limited, the high speed of breaking of the current results in the safe operation of the IGBT being exceeded due to the surge voltage ($-L_0 \cdot dIC/dt$) produced by the stray inductance $L_0$, with the risk of deterioration of the device.

FIG. 10c shows an example of the safe operating region of an IGBT. It is necessary to lower the surge voltage VCEP as the current IC is increased. In particular, if the capacity of the converter is increased, the current on fault also becomes large, but, since constructional considerations prevent the stray inductance from being decreased, the surge voltage will tend to show a corresponding increase.

Accordingly, in order to lower the surge voltage, the only expedient available is to lower the rate of current change dIC/dt.

Finally, the current, which has been limited to 250% to 500% must be subjected to a breaking operation by turning off the drive signal. The surge voltage that is thereby generated is determined by ($-L_0 \cdot dIC/dt$). If this surge voltage passes outside the reverse bias safe operating region of the transistor, the transistor will be permanently damaged. In the case of breaking a current of 200%, the safe operating region of the IGBT falls to about 80% of its rated voltage.

In particular, if the capacity of the converter is increased, stray inductance $L_0$ also tends to increase, and, since current IC is proportional to the capacity, there is a considerable increase in surge voltage. This results in the snubber circuit (surge absorption circuit) occupying more area and representing more cost than the main devices of the transistors.

SUMMARY OF THE INVENTION

Accordingly, one object of this invention is to provide an overcurrent protection circuit for a power transistor which can detect and limit the overcurrent of the transistor at high speed and can then break the overcurrent with a high reliability.

Another object of this invention is to provide an overcurrent protection circuit for a power transistor which can detect and limit the overcurrent of the transistor at high speed and can then break the overcurrent with a high reliability with the surge voltage generated on breaking the overcurrent being suppressed.

These and other objects of this invention can be achieved by providing an overcurrent protection circuit for a power transistor for flowing a main current in response to a gate drive voltage generated by a gate circuit. The overcurrent protection circuit includes a current detection circuit for detecting the main current flowing in the power transistor to generate a detection voltage corresponding to the main current, and a level detection circuit connected to receive the detection voltage for generating a control current corresponding to a difference between the detection voltage and a prescribed value when the detection voltage exceeds the prescribed value. The overcurrent protection circuit further includes a current control circuit connected to receive the control current for limiting the main current by regulating the gate drive voltage based on the control current, and a drive instruction control circuit connected to receive the control current for making the main current zero by controlling the gate drive voltage to an OFF condition based on the control current.

According to one aspect of this invention, there is provided an overcurrent protection circuit for a power transistor for flowing a main current in response to a gate drive voltage generated by a gate circuit. The overcurrent protection circuit includes a current detection circuit for detecting the main current flowing in the power transistor to generate a detection voltage corresponding to the main current, and a level detection circuit connected to receive the detection voltage for generating a control current corresponding to a difference between the detection voltage and a prescribed value when the detection voltage exceeds the prescribed value. The overcurrent protection circuit further includes a current control circuit for bypassing the control current from the gate circuit to the level detection circuit so as to limit the main current by lowering the gate drive voltage, and a forcible turn-off circuit for closing and self-holding itself when the control current continues for a prescribed time for branching the control current progressively therein and for lowering the gate drive voltage forcibly to turn the power transistor off. The gate drive voltage is controlled, firstly by the current control circuit, then by the current control circuit and the forcible turn-off circuit such that the control current flowing to the level detection circuit decreases whereas a current branching in said forcible turn-off circuit increases, and finally by the forcible turn-off circuit to break the main current in a soft manner.

When the main current flows in the transistor, the current detection circuit outputs a detection voltage proportional to the main current. When this detection voltage exceeds the set voltage of the level detection circuit, a control current corresponding to this difference is output. In accordance with this control current, the current control circuit performs current limiting control by lowering the drive voltage of the transistor so as to suppress the main current. When the control current is output, the drive instruction control circuit controls the drive voltage to the OFF condition, thereby making the main current of the transistor zero.

When overcurrent to the power transistor exceeds a prescribed value, a control current corresponding to this current flows from the gate circuit, lowering the gate voltage. When the gate voltage drops, the conduction resistance of the power transistor increases, functioning as a current control loop whereby the overcurrent is suppressed, so that the overcurrent can be maintained practically in the vicinity of the prescribed value. When the control current flows, the drive signal of the power transistor is held in the ON condition, and OFF action cannot be performed by the drive signal. If the control current continues for a prescribed time, the prescribed circuit in the forcible turn-off circuit is closed and self-holding is performed. The control current is then progressively branched to the prescribed circuit. When, with gradual increase in this branched current, the control current produced by said current control loop is zero, a changeover takes place to an open loop by the forcible turn-off circuit. Then, there is a further gentle fall in the gate voltage, with the result that the current flowing in the power transistor is gently broken. If the control current continues for a fixed time (including the time until the power transistor current becomes zero), the drive signal returns to the OFF condition, causing the self-holding condition to be released and to return to the initial condition.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
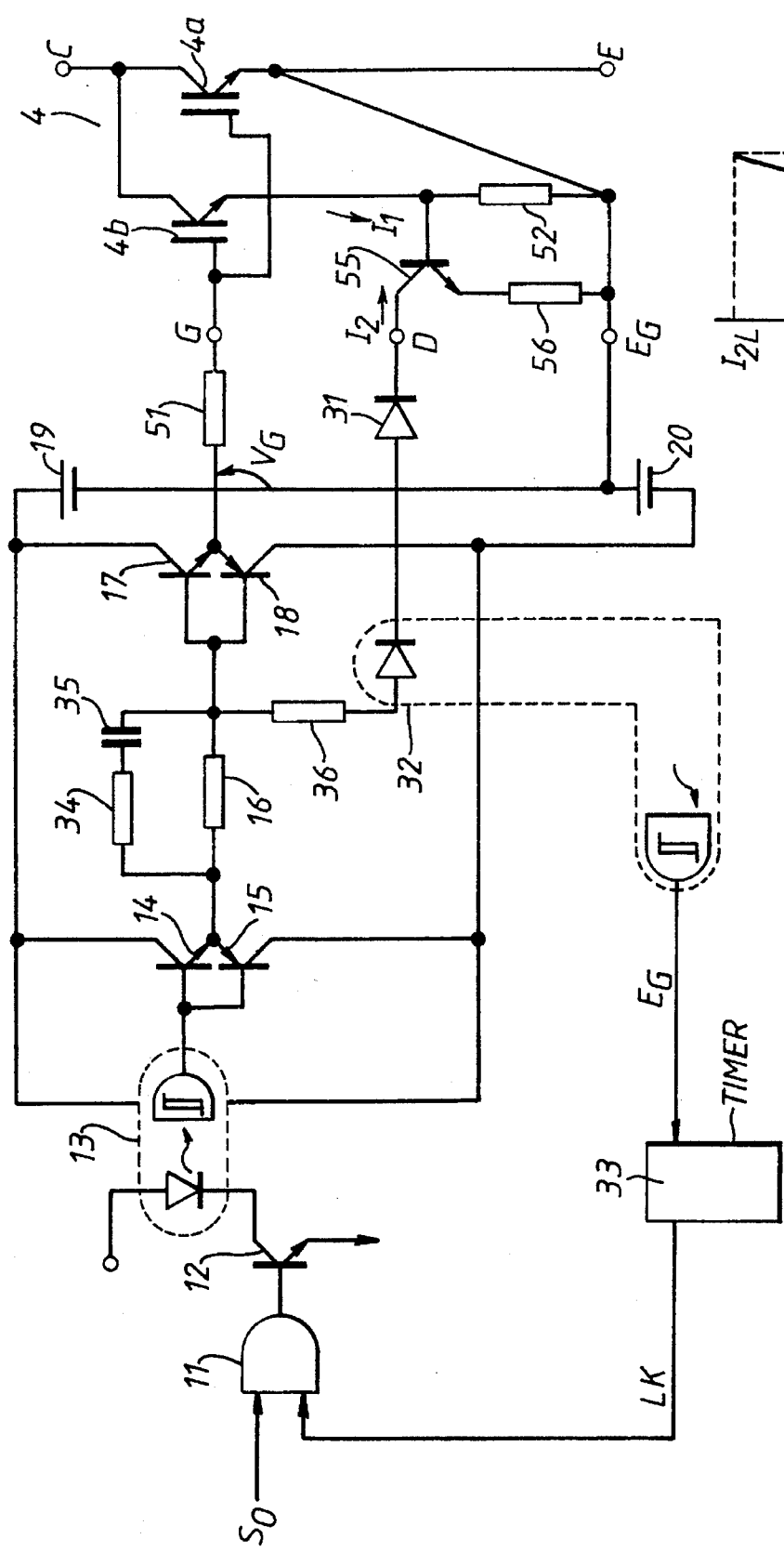
FIG. 1 is a circuit diagram showing an overcurrent protection circuit for a power transistor according to a first embodiment of this invention.

Referring now to the drawings, wherein like reference numerals designate identical or corresponding parts throughout the several views, the embodiments of this invention will be described below.

Figure 1B:
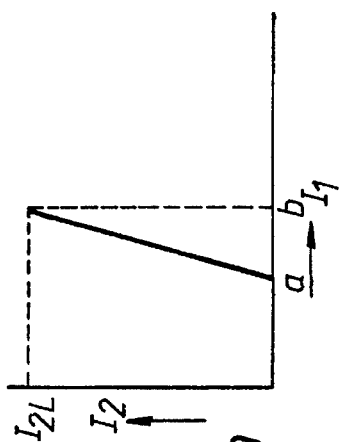

A first embodiment of this invention is shown in FIG. 1. In FIG. 1a, IGBT 4 consists of IGBT 4a that controls the main current and a sensing IGBT 4b for current detection. Their respective gates and collectors are connected in parallel, while their emitters are constituted as respective independent terminals. AND circuit 11 turns transistor 12 ON or OFF in response to drive signal S0. In photocoupler 13, current flows in the light emitting diode in accordance with whether transistor 12 is ON or OFF. Photocoupler 13 is further provided with an insulated phototransistor that is actuated by gate power sources 19 and 20. Transistors 14 and 15 that are complimentarily connected are turned ON or OFF in response to transistor 12 being turned ON or OFF through photocoupler 13. Their output voltage is applied to the gates of transistors 17, 18 that are complimentarily connected through a resistor 16 and a series circuit of a resistor 34 and a capacitor 35, and is thus subjected to power amplification. The output voltage VG of transistors 17 and 18 is applied to the gates of IGBT 4a and 4b through a resistor 51 as drive voltage of the IGBTs 4a and 4b. In transistor 55, current starts to flow to the base when the voltage drop of resistor 52 produced by emitter current I1 of sensing IGBT 4b exceeds the threshold voltage between the base and emitter, and a current I2 proportional to the difference flows to the collector, as shown in FIG. 1b. This current I2 flows through a resistor 36, a photocoupler 32 and a diode 31 mainly from the emitters of transistors 14 and 15 and from the base voltage of transistors 17 and 18, which are complimentarily connected. Photocoupler 32 has a phototransistor that is actuated by an insulated control power source when current I2 flows, and outputs an abnormality signal EG. Timer 33 outputs signal LK which is normally "1", and, if abnormality signal EG continues to be output for a prescribed time, it makes output signal LK "0" on time-up.

In the above construction, when drive instruction S0 becomes "1", transistor 12 is turned ON by the output of AND circuit 11, causing transistor 14, which is complimentarily connected, to be turned ON through photocoupler 13. The voltage of gate power source 19 is thereby applied to the gates of transistors 17 and 18, which are complimentarily connected, through resistor 16 and the series circuit consisting of resistor 34 and capacitor 35, and is subjected to power amplification. The output voltage VG of the transistors 17 and 18 is applied to the gates of IGBT 4a and 4b through resistor 51, turning IGBT 4a and 4b both ON. And when drive instruction S0 becomes "0", transistor 12 is turned OFF, turning transistor 14 OFF by means of the output of photocoupler 13, thereby turning transistor 15 ON, turning transistor 17 OFF, and transistor 18 ON, causing negative bias voltage to be applied to the gates of IGBT 4a and 4b, and turning IGBT 4a and 4b both OFF. In this case, the series circuit of resistor 34 and capacitor 35 acts as an advancing circuit, causing the gate voltage to change rapidly.

When overcurrent flows in IGBT 4a when IGBTs 4a and 4b are ON, with drive instruction S0 in the "1" condition, the emitter current I1 of IGBT 4b passes the point "a" shown in FIG. 1b (base-emitter threshold voltage of transistor 55), causing current I2 to flow in the collector of transistor 55. The drop in the voltage of resistor 16 produced by this current I2 lowers the gate voltage of transistors 17 and 18, which are complimentarily connected, decreasing the gate voltage of IGBTs 4a and 4b.

Figure 2A:
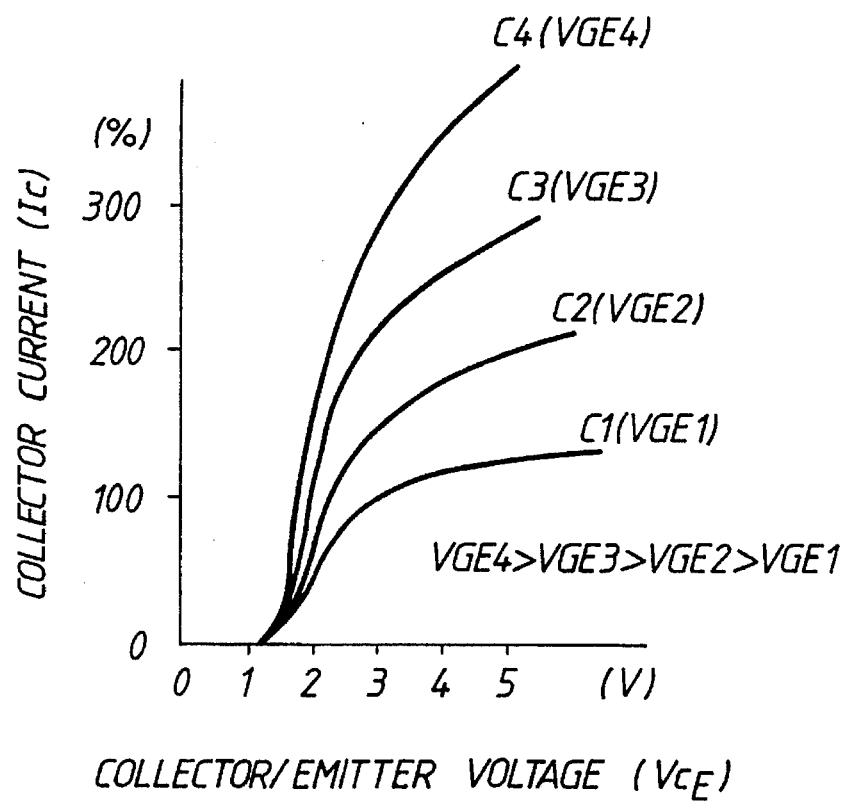
FIG. 2 is a diagram given in explanation of the action of the first embodiment.

FIG. 2a is an IGBT characteristic, and shows the relationship between collector-emitter voltage VCE and collector current IC, taking the gate voltage as a parameter. As can be seen from this Figure, the collector current of the IGBT changes in response to the gate voltage. Normally, the IGBT is turned ON by a large gate voltage in order to make its ON voltage small. As a result, when load short-circuit etc occurs, a large overcurrent can flow.

However, in this embodiment, as described above, when overcurrent flows in the IGBTs 4a and 4b, the gate voltage of IGBTs 4a and 4b fall, causing the ON voltage Vcc of IGBT 4a to rise so that the overcurrent is suppressed to within a prescribed range.

In FIG. 1b, taking the current I2 at which the gate voltage is lowered to a gate voltage such that the current of IGBT 4a is the current-controlled value as being I2L, and taking the current I1 of IGBT 4b for this current I2L to flow as being the point b, control is effected such that current I1 is held at point b by means of a current control loop in the circuit shown in FIG. 1a.

Thus, when the current control action commences, an abnormality signal EG is output from photocoupler 32 by current I2L, thereby commencing time-counting by timer 33. If this current control action continues for a prescribed time, timer 33 reaches "count up", as a result of which its output signal LK becomes "0", thereby closing the gate of AND circuit 11 so that, even when drive instruction S0 is in the "1" condition, transistor 12 is forcibly turned OFF. by this means, the gate voltages of IGBTs 4a and 4b are negatively biased, and the overcurrent is cut off.

Figure 2B:
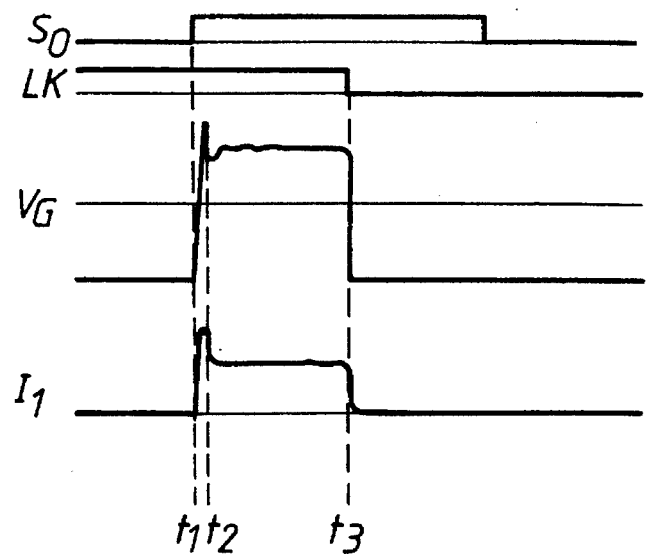

FIG. 2b shows a time chart for the case where drive instruction S0 is made "1" in the condition with the load short-circuited. At time t1, drive instruction S0 changes from "0" to "1", whereupon the gate voltage VG changes from negative to positive and IGBTs 4a and 4b are turned ON. A short-circuit current starts to flow in IGBT 4a and emitter current I1 of IGBT 4b rapidly rises, causing current I2 to flow in the collector of transistor 55. This starts the current control action. By this current control action, gate voltage VG is controlled to a low value at time point t2 and current I1 is controlled to a prescribed value. If this condition continues for a prescribed time, at time t3, the output signal LK of timer 33 changes from "1" to "0", causing gate voltage VG to return to negative, with the result that the currents of IGBTs 4a and 4b become zero and current I1 becomes zero.

According to this embodiment, an overcurrent is detected and limited to a prescribed current at high speed, as described above. An abnormality signal is concurrently output. If this condition continues for a prescribed time, the current is made zero by putting the drive voltage of IGBT into the OFF condition. The reliable overcurrent protection of the IGBT can thereby be achieved.

In this embodiment, the current is made zero at a prescribed time after the abnormality signal is output. The prescribed time is provided for avoiding an incorrect operation of the overcurrent protection circuit due to noise or etc. This invention is not limited to this embodiment. Theoretically, the overcurrent protection circuit according to this invention can therefore function well, even if the prescribed time is small or zero.

Figure 13:
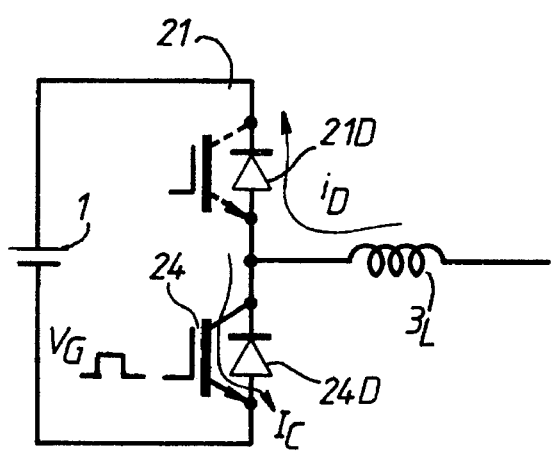
FIG. 13 is a diagram given in explanation of the problems in operation of a main circuit using an IGBT.
Figure 13:
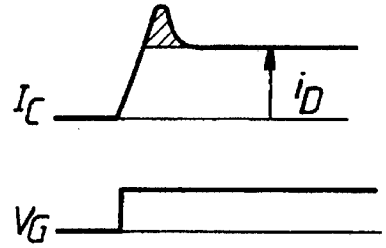

It should be noted that when current limiting action is performed, resistor 34 and capacitor 35 act as a delay circuit preventing oscillation when the gain ($\Delta$I2/$\Delta$I1) of transistor 55 is made large and the distance a–b in FIG. 1b is made small. This enables stable operation, and, as shown in FIG. 2b, acts to delay the time point t2 at which the gate voltage VG drops. By the action of this delay circuit and of the delay circuit created by gate resistor 51 and the gate-emitter capacity of IGBTs 4a and 4b, current I1 overshoots until it reaches the current limiting value. This overshoot current I1 performs a convenient action in application to an actual IGBT circuit. Specifically, it performs the action of compensating for the amount of the increase (shaded portion) due to the recovery current flowing in diode 21D of the circuit of FIG. 13 described above. In this way, in this embodiment, the current limiting value can be set to a lower value by positively utilizing the overshoot of the current produced by the current limiting control loop. Resistor 34 and capacitor 35 of FIG. 1 can be dispensed with if the recovery current of the diode connected in antiparallel with the IGBT is small.

Figure 3A:
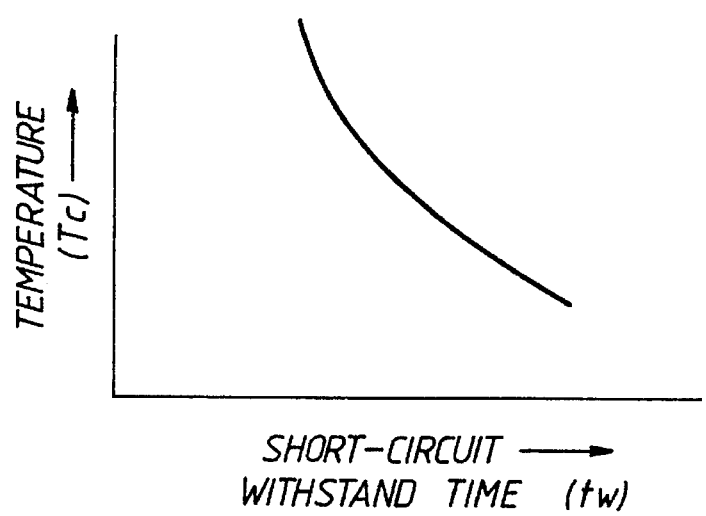
FIG. 3 is a diagram given in explanation of another action of the first embodiment.

The temperature TC of the IGBT and short-circuit withstand time tw have a relationship shown in FIG. 3a. As the temperature TC rises, the withstand time tw becomes shorter. For example, when the temperature TC is 125° C., the withstand time tw is reduced to practically one half of what it is when the temperature TC is 25° C.

Figure 3B:
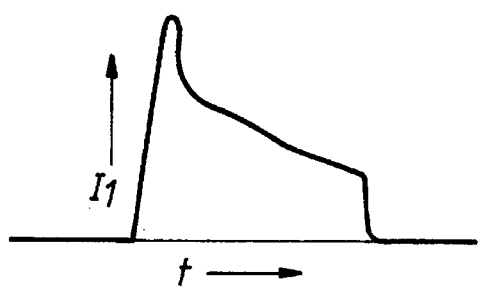

Accordingly, utilizing the characteristic that the threshold voltage of transistor 55 decreases in response to increasing temperature, the apparent short-circuit withstand time can be extended by lowering the short-circuit current (current limiting value) as shown in FIG. 3b with rise in temperature of the IGBT, by arranging bipolar transistor 55 at a location which is close in temperature to the IGBT (for example the emitter bonding location would be desirable, but an insulating pad location at a little distance from this would be acceptable).

Figure 3C:
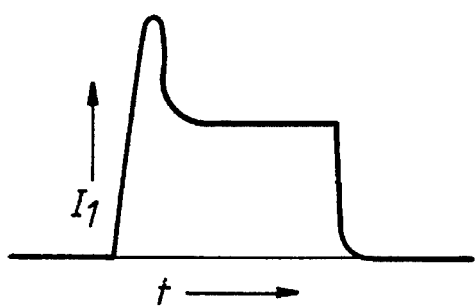

FIG. 3c shows a case where a MOSFET is employed as transistor 55, to give a fixed current characteristic unaffected by temperature. However, in this case too, a characteristic as shown in FIG. 3b can be achieved by arranging resistor 52 at a location close in temperature to the IGBT, and by using a resistor of positive temperature coefficient.

It should be noted that, if IGBT 4a and IGBT 4b are constituted by respective separate chips, it may happen that, the gate voltage of IGBT 4b being lower to the extent of the voltage drop of resistor 52, a proportional relationship is not obtained between the main current flowing in IGBT 4a and the detected current flowing in IGBT 4b. In such cases, a proportional relationship may be established between the main current and the detected current in the range of the current limiting action by setting the threshold voltage of the gate of IGBT 4b lower by an amount matching the voltage drop of resistor 52 when current limiting action takes place.

Figure 4A:
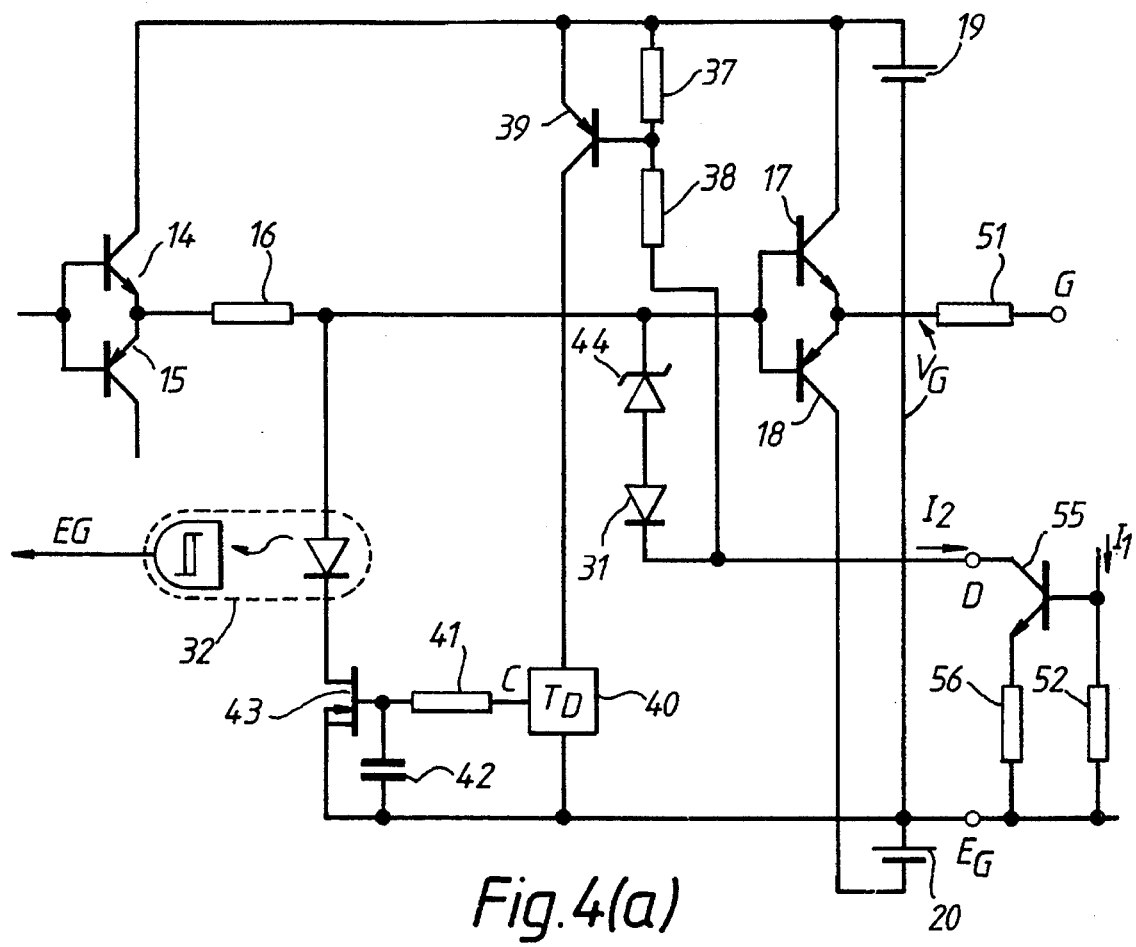
FIG. 4 is a circuit diagram showing an overcurrent protection circuit for a power transistor according to a second embodiment of this invention.
Figure 4B:
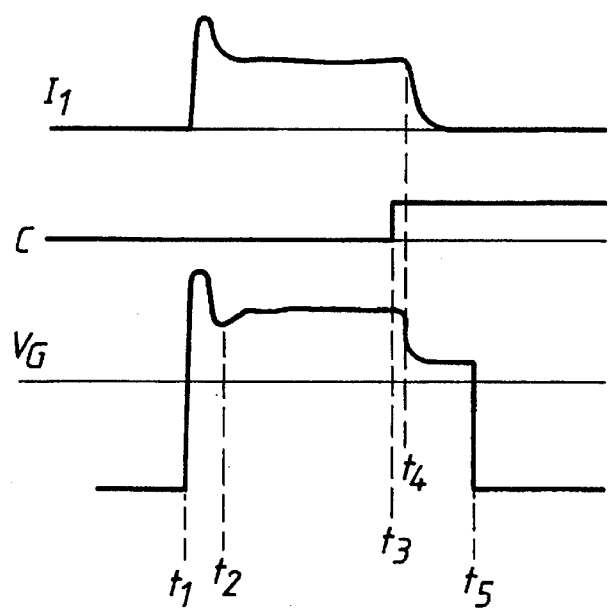

FIG. 4 shows a second embodiment of this invention. FIG. 4a is a view showing the layout of the main units, and FIG. 4b is a waveform diagram giving an explanation of the action.

When the gate voltage VG goes from negative to positive at time point t1 on application of a drive instruction in a condition with the load of the IGBT short-circuited, a short-circuit current flows in the IGBT, and a detection current I1 proportional to the short-circuit current flows. When, as a result, current I2 flows in the collector of transistor 55 through diode 31 and Zener diode 44, a voltage drop occurs in resistor 16, causing the gate voltage VG to drop at time point t2 a value at which the short-circuit current is suppressed to the current limiting value. Also, at the same time as the commencement of the current limiting action, current flows through resistors 37 and 38 and transistor 39 is turned ON, causing the time-counting action of time delay circuit 40 to be commenced. At time point t3 after the passage of a prescribed time period, a control signal c is output from time delay circuit 40, causing positive voltage to be applied to the gate of MOSFET 43 through resistor 41. A capacitor 42 is provided at the gate of MOSFET 43. The gate voltage of MOSFET 43 rises after a delay time. MOSFET 43 gradually starts to conduct at time point t4, with the result that the gate voltage VG of the IGBT gradually falls to a value a little higher than zero. The IGBT current is also thereby gradually reduced to zero and its detection current I1 is also gradually reduced as shown in the Figure until it becomes zero. Photocoupler 32 is actuated by the current flowing in MOSFET 43 to output an abnormality signal EG. This signal EG causes the output of the drive instruction to be interrupted so that at time point t5 gate voltage VG is negatively biased.

With this second embodiment, after the overcurrent has continued for a prescribed time, it is gradually reduced, so the surge voltage can be made to have a low value.

It should be noted that Zener diode 44 is only provided with the object of performing a limiting action so that the gate voltage does not fall too far. It can therefore be replaced by a resistor, or omitted.

Also, a delay circuit for regulating the amount of overshoot can be added downstream of transistor 55 by the provision of an amplifier circuit etc. at that location.

Furthermore, according to this invention an IGBT module may be adopted in which IGBTs 4a and 4b, resistor 52 and the level detection unit constituted by transistor 55 and resistor 56 are accommodated in a single package. By using such IGBT modules, a high degree of freedom regarding the layout and application of the main circuit can be provided. When such IGBT modules are used connected in parallel, it is possible to arrange that overcurrent protection is provided by using the output signal of the level detection unit that is actuated fastest to suppress the gate voltages of all of the IGBTs that are connected in parallel. In this way, overcurrent protection can easily be achieved even when a large-capacity device is employed.

Figure 5:
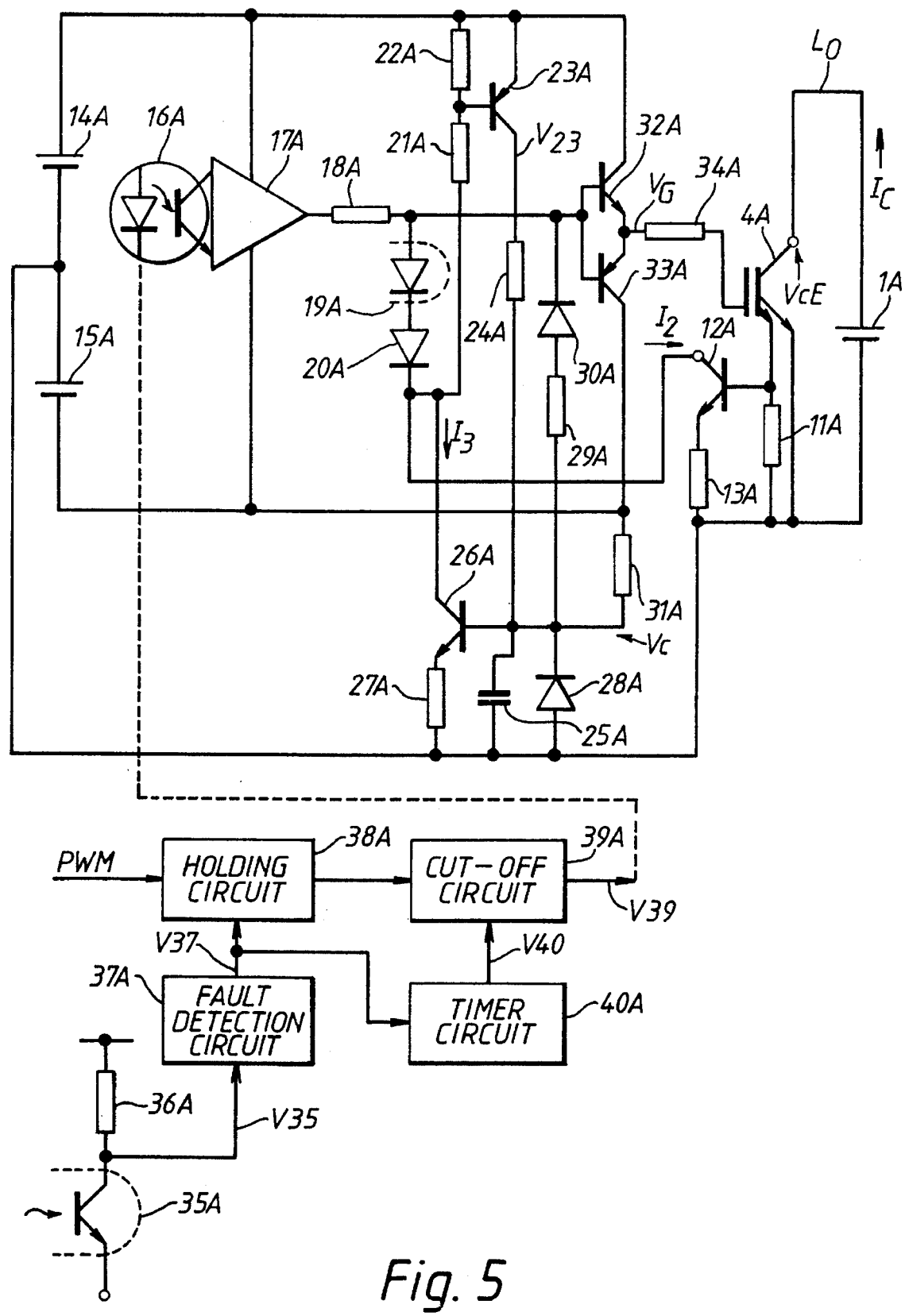
FIG. 5 is a circuit diagram showing an overcurrent protection circuit for a power transistor according to a third embodiment of this invention.

A third embodiment of this invention is shown in FIG. 5. In FIG. 5, IGBT 4A is normally connected through the load to DC power source 1A. In this embodiment, however, taking into consideration protection when the load is short-circuited, the Figure shows the case where the load impedance is zero. An emitter follower circuit consisting of transistor 12A and resistor 13A is constituted, wherein part of the current on the emitter side of IGBT 4A is converted to voltage by resistor 11A.

In the gate drive circuit of IGBT 4A, DC power sources 14A and 15A are the drive sources. Gate drive of the IGBT 4A is performed through gate resistor 34A by positive and negative gate drive voltages obtained by driving the bases of transistors 32A and 33A through resistor 18A using a drive signal amplified by amplifier 17A, the drive signal being isolated by photocoupler 16A. The emitter of IGBT 4A is at the potential of the series connection point of DC power sources 14A and 15A, so, when transistor 32A is turned on, the gate drive voltage becomes positive, and, when transistor 33A is turned on, the gate drive voltage becomes negative.

A resistor 18A is connected to the collector side of transistor 12A through light emitting diode 19A of a photocoupler and a diode 20A. The cathode side of diode 20A is connected to the base of transistor 23A through resistor 21A, and resistor 22A is connected between the emitter and base of transistor 23A. The emitter of transistor 23A is connected to the positive side of DC power source 14A. A capacitor 25A is charged through resistor 24A from the collector of transistor 23A. The connection point of resistor 24A and capacitor 25A is connected to the base of transistor 26A. The emitter of transistor 26A is connected to the series connection point of DC power sources 14A and 15A and to the other end of capacitor 25A through resistor 27A. The collector of transistor 26A is connected to the cathode of diode 20A. Diode 28A is connected in parallel with capacitor 25A so that excessive reverse voltage cannot be applied to transistor 26A. Connection is effected to the bases of transistors 32A, 33A through resistor 29A and diode 30A from the base of transistor 26A. The base of transistor 26A is also connected to the negative side of DC power source 15A through resistor 31A.

A photodetector transistor 35A of the photocoupler and resistor 36A are connected in series. When current flows in the light emitting diode 19A of the photocoupler, it is detected by fault detection Circuit 37A through the series circuit. The output signal V37 of the fault detection circuit 37A makes a PWM signal (pulse width modulation signal), held by a holding circuit 38A. The PWM signal is input to photocoupler 16A through cut-off circuit 39A. Output signal V37 of fault detection circuit 37A is connected so as to actuate cut-off circuit 39A through timer circuit 40A.

Figure 6:
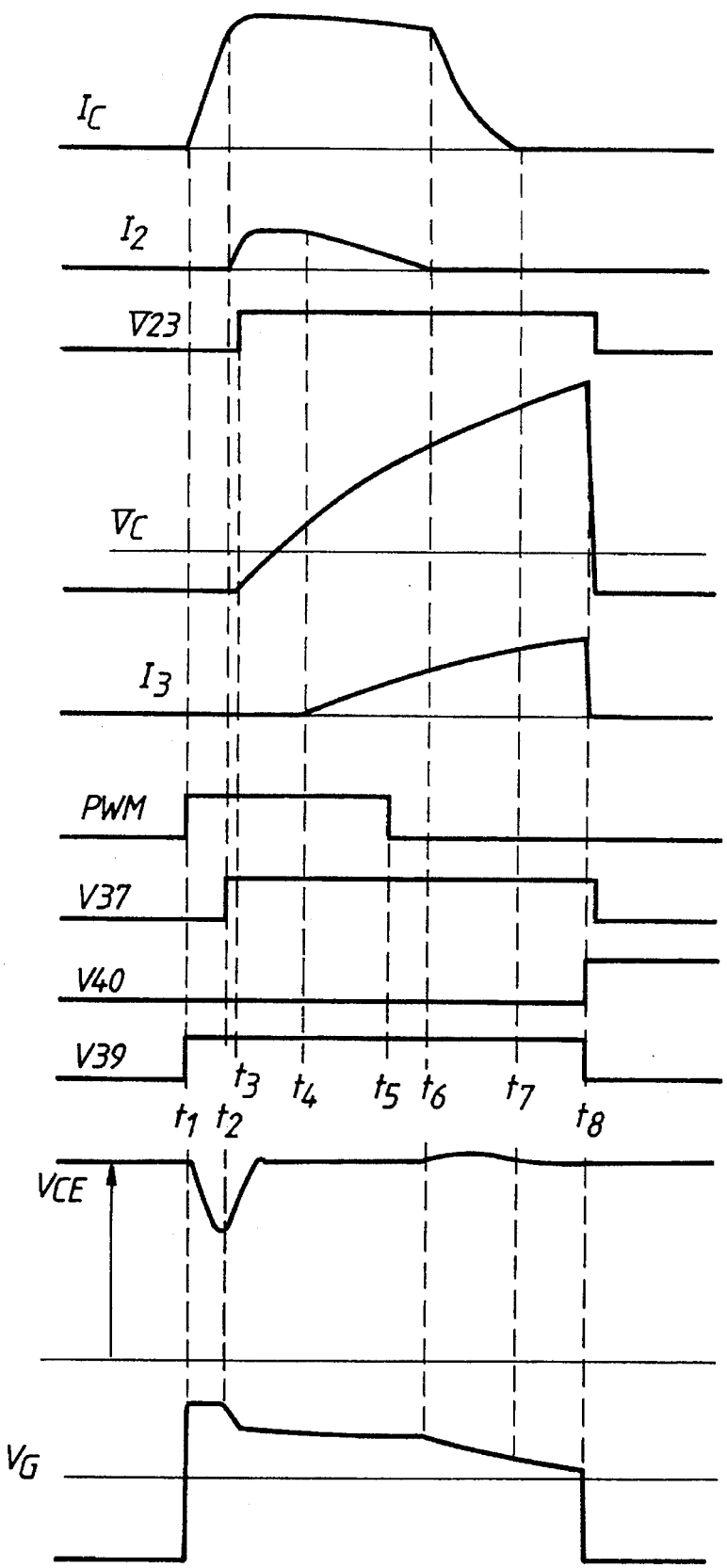
FIG. 6 is a diagram showing the waveforms given in explanation of the action of the third embodiment.

The action of this embodiment constructed as above will now be described with reference to FIG. 6. When, the PWM signal is made "1", photocoupler 16A is driven by output voltage V39 of cut-off circuit 39A, whereupon transistor 33A is turned off and transistor 32A is turned on through amplifier 17A, and resistor 18A, and gate drive voltage VG is changed over from negative to positive.

When positive voltage is applied to the gate of IGBT 4A, the IGBT 4A is turned on. In the condition where the load is short-circuited, DC power source 1A is applied between the collector and emitter of IGBT 4A, turning on the IGBT, whose internal resistance accordingly falls. When this happens, collector current IC of the IGBT 4A Rapidly rises, the slope of which is limited by the stray inductance L0 of the circuit. Some part of this current is detected by resistor 11A as a voltage signal. And at time point t2, a current I2 flows to the collector of transistor 12A which is proportional to the amount of increase in current IC from the point where this detected voltage exceeds the threshold voltage between the base and emitter of transistor 12A. This current I2 flows in the circuit comprising resistor 18A, photocoupler 19A, and diode 20A, increasing the voltage drop of resistor 18A, with the result that gate drive voltage VG starts to fall.

On the other hand, part of current I2 is also branched to the circuit comprising resistors 22A and 21A, so at time point t3b transistor 23A is turned on and outputs a voltage V23 which starts to charge capacitor 25A through resistor 24A. This charged voltage VC rises from negative towards positive and, exceeds the base emitter threshold voltage of transistor 26A at time point t4. After time point t4 due to the emitter follower action of transistor 26A and resistor 27A, transistor 26A flows a current proportional to the part of VC which is over the threshold voltage as the current I3. Also, when the current I3 flows, transistor 23A is subject to self-holding, so, even if the current I2 becomes zero, this condition is held.

In the interval of time points t2 to t4, when the current IC IGBT 4A exceeds a fixed value the current I2 flows, lowering the gate voltage of the IGBT 4A, thereby increasing the ON resistance of the IGBT 4A and decreasing The current IC. Thus, a control loop action is performed whereby the short-circuit current is controlled to a practically fixed value.

Next, in the period between time points t4 to t6, the gradually increasing current I3 is input as an external disturbance. Balance is achieved by reducing the current I2 to the extent that the current I3 increases, and at time point t6 the current I2 becomes zero. This period t4 to t6 is a period in which there are superimposed constant IC current control and a forcible turn-off control that forcibly lowers the gate voltage and so lowers IC. Thus, the action of the constant IC control loop slightly decreases the current IC in this period.

Next at time point t6, the current I2 becomes zero. After time point t6 the voltage drop of resistor 18A increases with increase in the current I3, resulting in a gentle fall in the voltage VG (but somewhat faster than during the period t4 to t6). Accordingly, the current IC is also broken in a comparatively soft manner and is fully broken at time point t7. The surge voltage across the collector and the emitter of the IGBT 4A can thereby be diminished. In this way, the IGBT 4A can be completely cut off with high reliability within the safe operating region if an overcurrent condition continues after time point t4.

The circuit is constituted such that if the overcurrent condition is cancelled and the current I2 becomes zero before time point t4 is reached, transistor 23A is turned off so that the capacitor voltage VC is discharged by resistor 31A. The purpose of this is to avoid the IGBT 4A being turned off because of self-holding of transistor 23A due to overcurrent for a short period such as diode recovery current of opposite phase on bridge connection, or due to noise.

Next, the PWM signal is turned off at time point t5. However, photocoupler 19 detects the current I2 plus the current I3, and signal V39 of photocoupler 16A is held by fault detection circuit 37A and holding circuit 38A through photocoupler 35A.

Timer circuit 40 turns drive signal V39 off by means of breaker circuit 39 at a time point t8 later than the time point t7 at which current IC of IGBT 4A was cut off in a soft manner, and rapidly makes the voltage VG a negative voltage, while concurrently applying reverse bias to capacitor 25A by means of diode 30A and resistor 29A. The current of photocoupler 19A thereby becomes zero and fault signal V37 is reset.

With this embodiment, the safe operating time on short-circuit can be extended by lowering the short-circuit current to ¼ to ⅕ by adopting an IGBT constant current control loop arrangement. By effecting a smooth changeover from this constant current control loop to a forcible turn-off loop, and subsequently gradually lowering the gate voltage, the current change rate of the IGBT is lowered. As a result, the surge voltage is lowered and current breaking can be achieved with high reliability in the safe operating region of the IGBT.

The period for which this overcurrent flows is designed to be such that the gate drive signal is held and the fault current is not subjected to high speed cut-off. This is very effective in preventing the surge voltage becoming large, since, in particular when the converter capacity becomes large, the current value is increased without decreasing the stray inductance.

Figure 7:
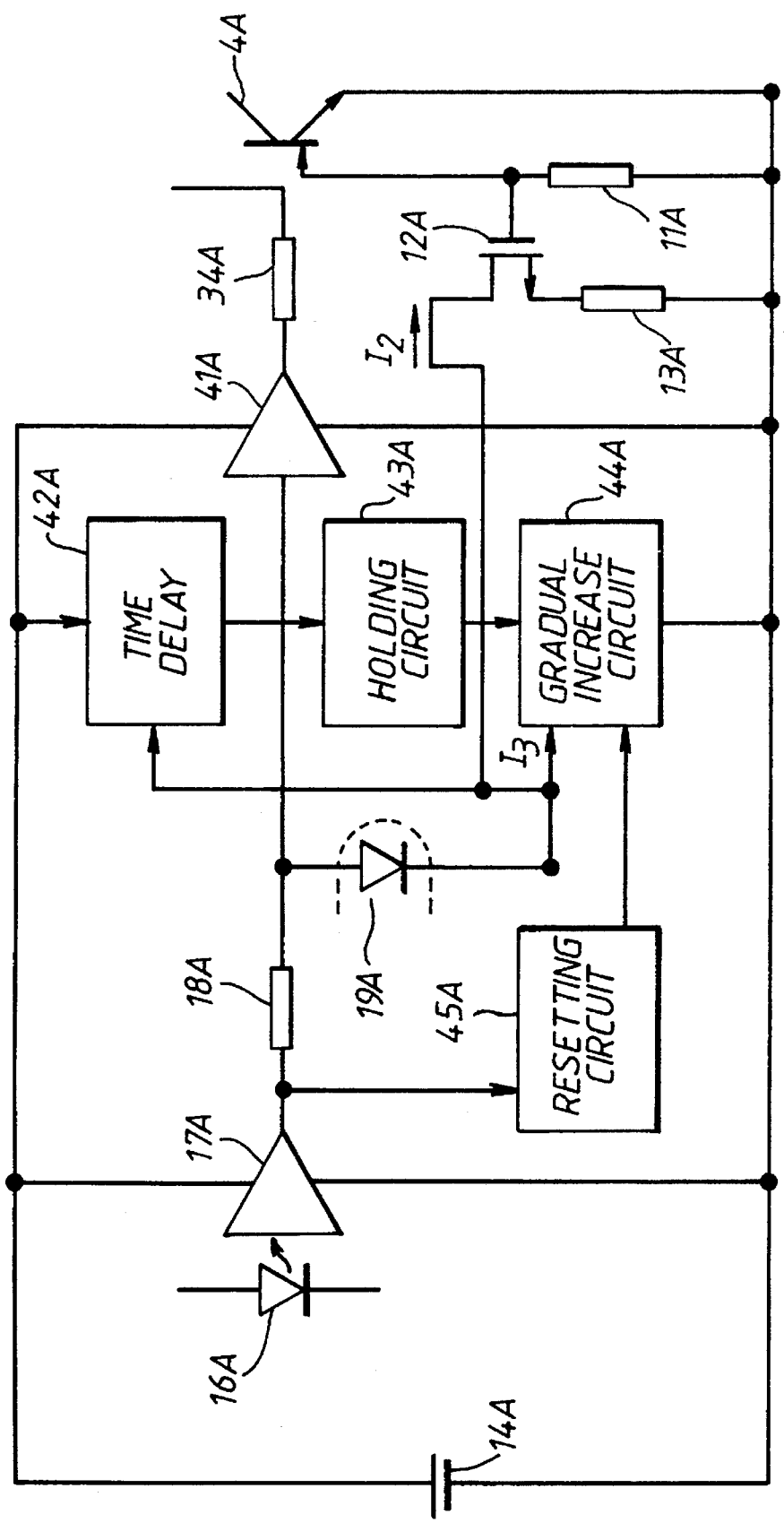
FIG. 7 is a circuit diagram showing an overcurrent protection circuit for a power transistor according to a fourth embodiment of this invention.

This invention is not limited to the circuit construction of the third embodiment, precisely described above. This invention can be effected by a circuit with a few block circuits, each of which performs the same function as the corresponding circuit parts in the third embodiment, respectively. A fourth embodiment of this invention, that is one of such embodiment, is shown in FIG. 7. Description of the parts which are common with FIG. 5 is omitted. In this embodiment, only positive voltage is employed for DC power source 14A for gate drive of the IGBT 4A.

Also, for current detection of IGBT 4A, rather than branching the main current, the internal potential of the IGBT 4A is directly detected. Also, the action is the same even in the case of detecting the current using a Hall current device or the like. An FET can also be employed for transistor 12A.

Furthermore, current I3 is increased by the provision of a gradual-increase circuit 44A through a time delay 42A that is actuated on detection of collector current I1 of transistor 12A, and a holding circuit 43A that performs self-holding after this time delay. The gradual-increase circuit 44A is reset when the output of amplifier 17A is made zero by resetting circuit 45A.

The fourth embodiment as described above, functions the same as the third embodiment, so that the detailed description of the function thereof is omitted.

Figure 8:
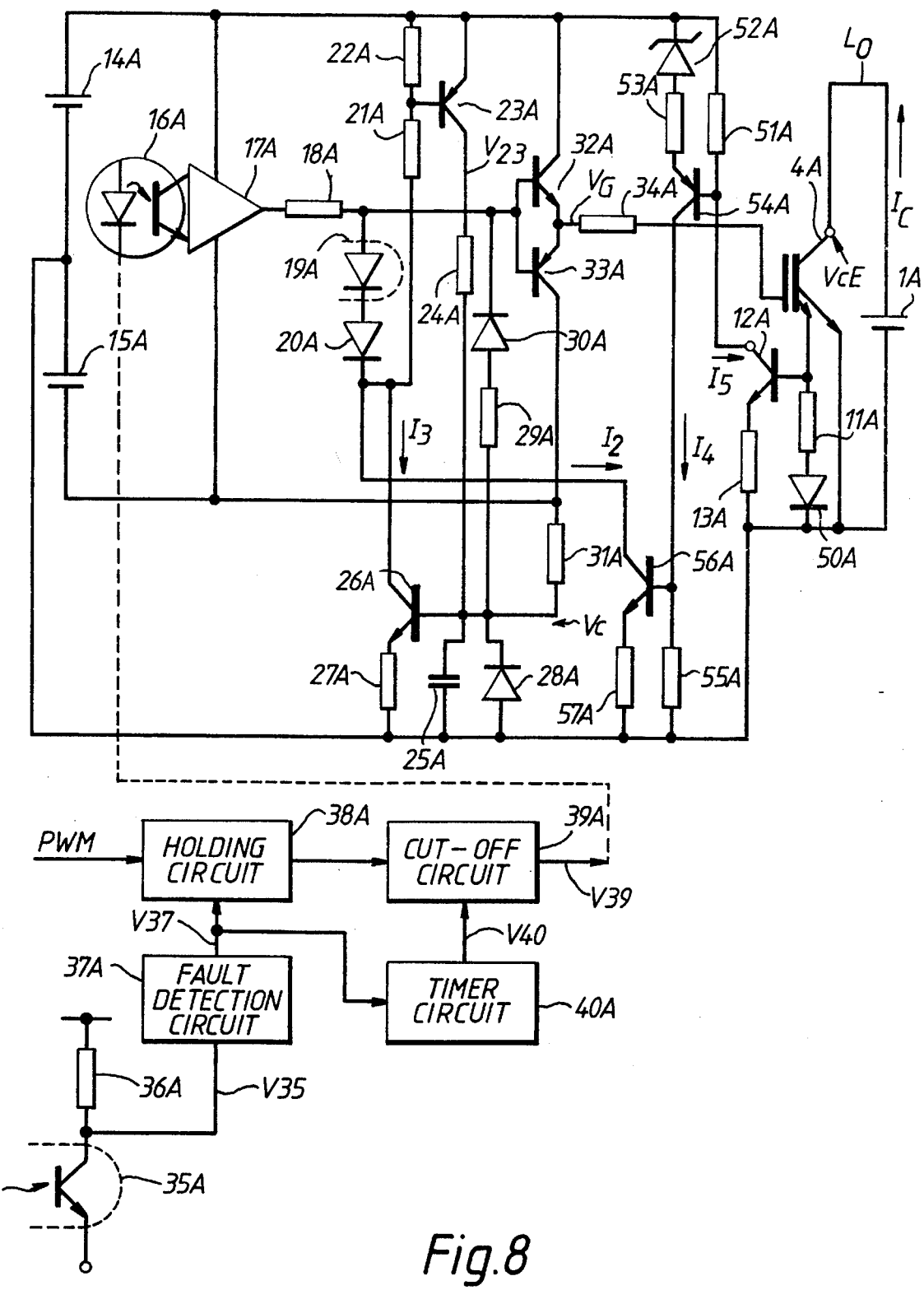
FIG. 8 is a circuit diagram showing an overcurrent protection circuit for a power transistor according to a fifth embodiment of this invention.
Figure 9A:
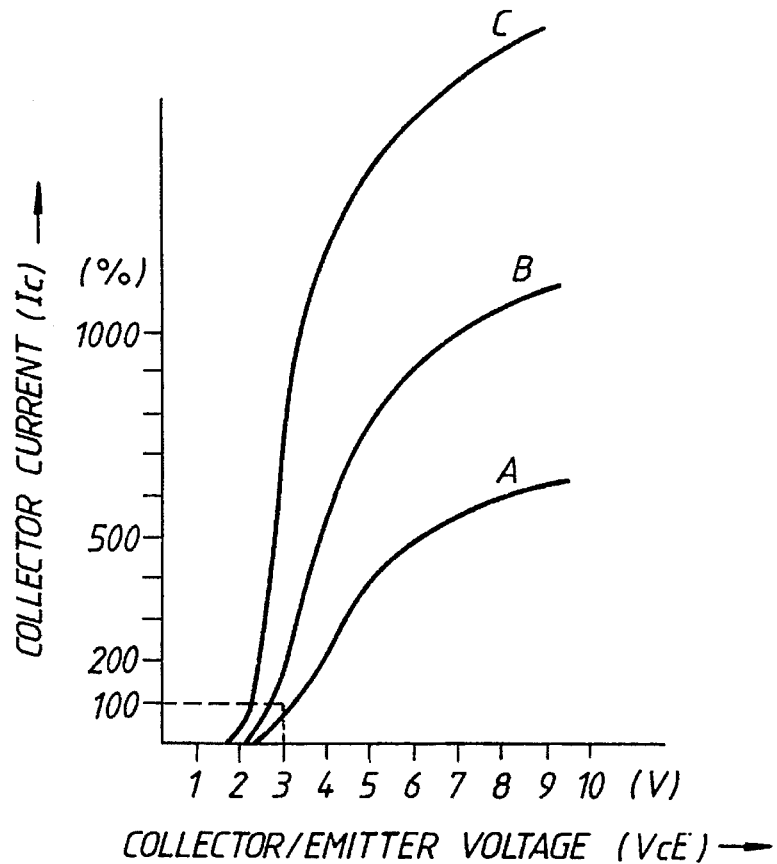
FIG. 9 is a diagram given in explanation of the technical background of this invention.
Figure 9B:
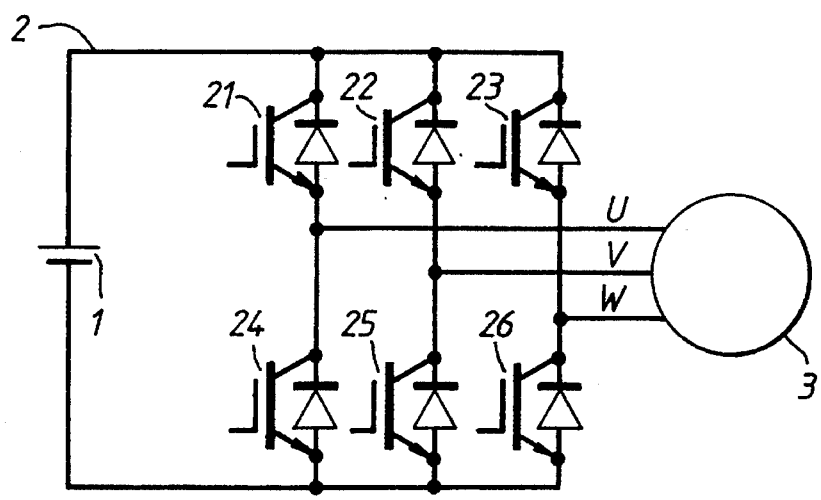
Figure 10A:
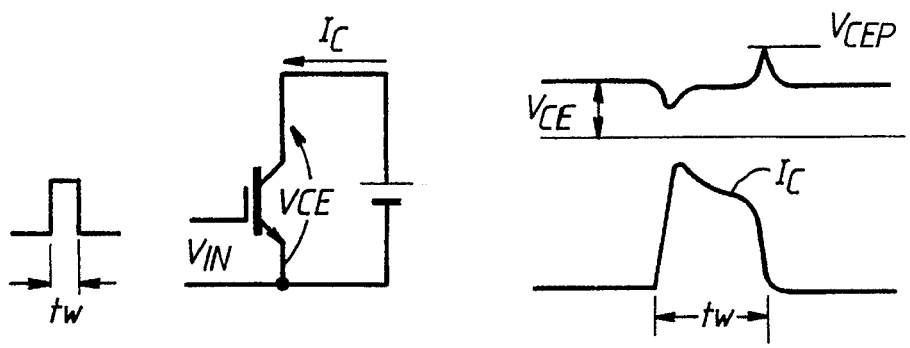
FIG. 10 is a diagram given in explanation of the overcurrent withstand capability of a power transistor.
Figure 10B:
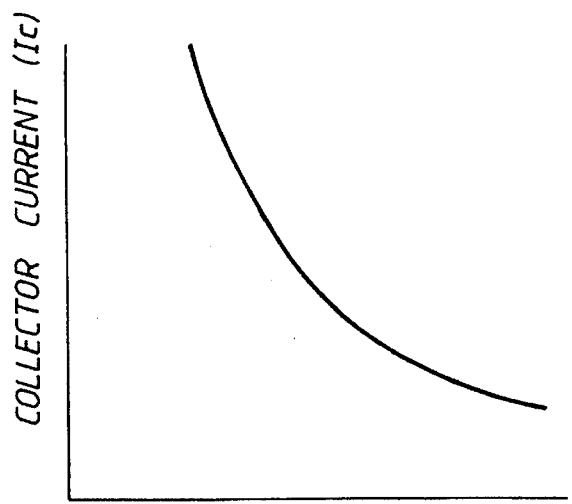
Figure 10C:
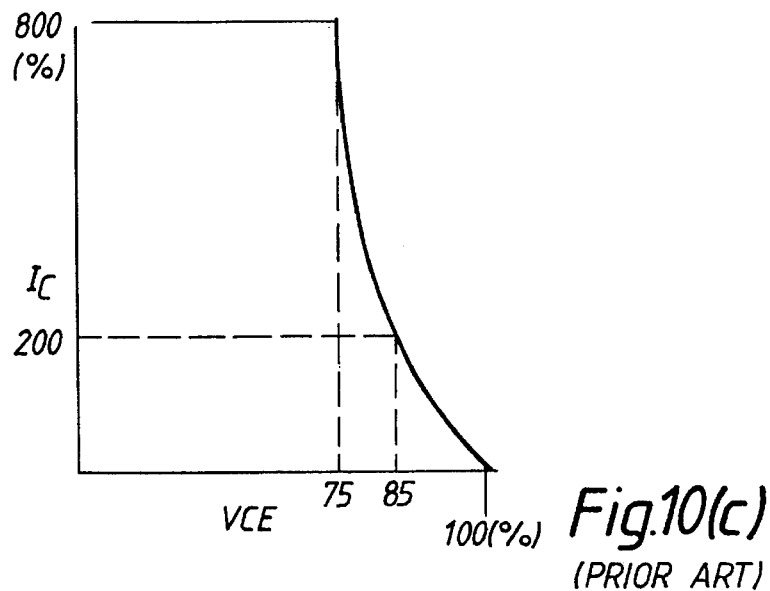
Figure 11A:
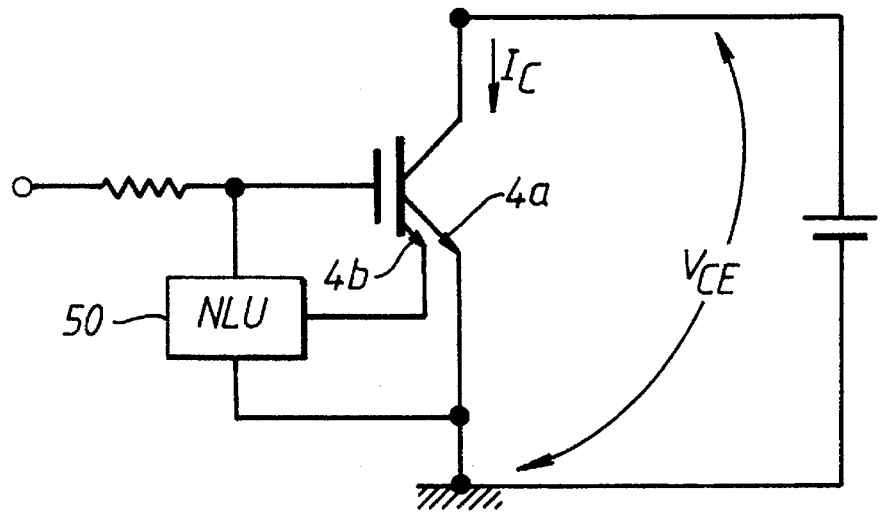
FIG. 11 is a diagram given in explanation of a prior art IGBT equipped with an overcurrent protection function.
Figure 11B:
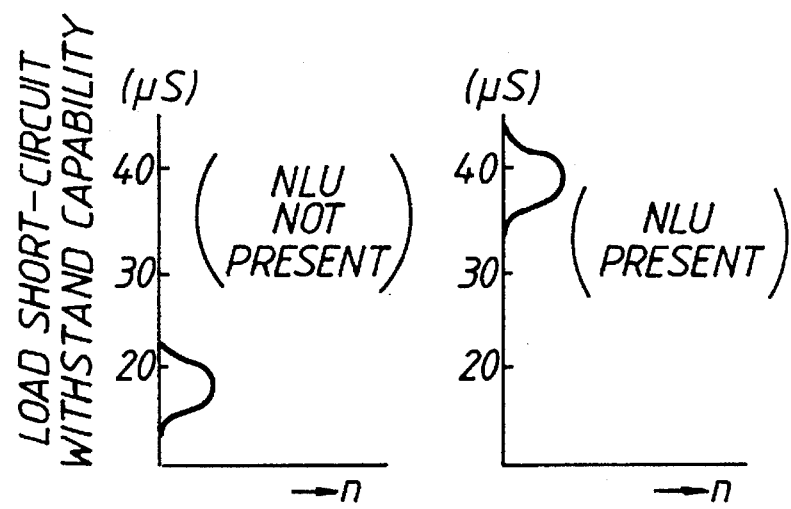
Figure 11C:
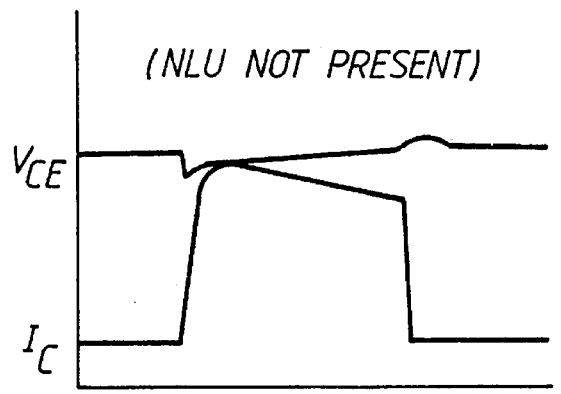
Figure 11C:
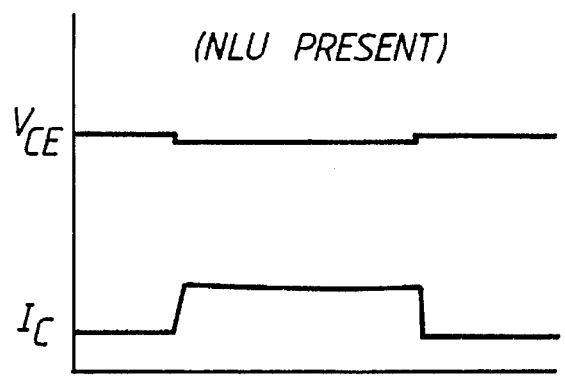
Figure 11D:
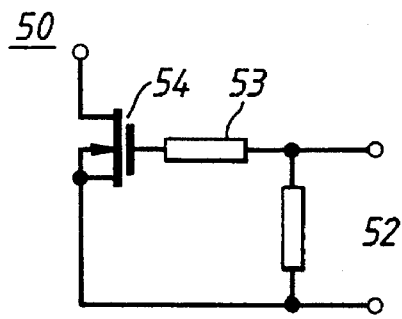
Figure 11E:
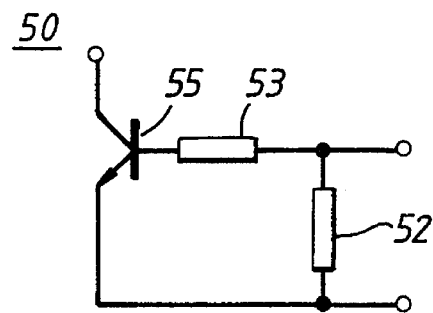
Figure 12:
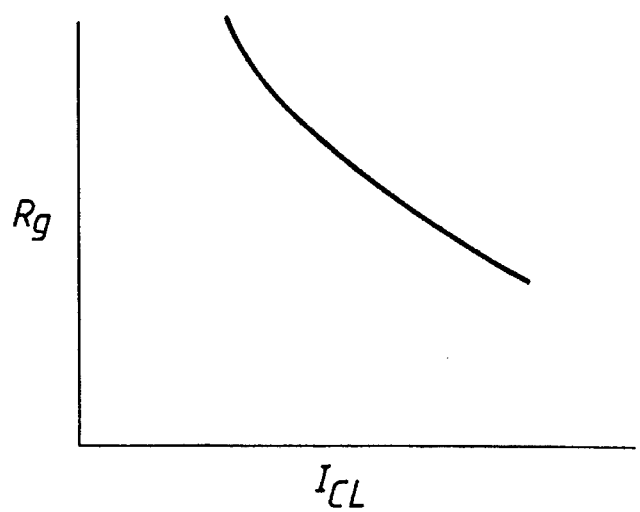
FIG. 12 is a characteristic graph given in explanation of problematical points regarding the prior art.

FIG. 8 shows a fifth embodiment of this invention. In FIG. 8, the parts added to the circuit shown in FIG. 5 are a diode 50A, a resistor 51A, a Zener diode 52A, a resistor 53A, a transistor 54A, a resistor 55A, a transistor 56A and a resistor 57A.

Next, the action of this embodiment will be described below. The diode characteristic of the base and emitter of transistor 12A is cancelled by diode 50A connected in series with resistor 11A. The current I5 proportional to current Ic flows to the collector of transistor 12A. When the voltage drop of resistor 51A caused by current I5 exceeds the voltage of zener diode 52A and the voltage between the base and the emitter of transistor 54A, current I4 flows through the collector of transistor 54A by the emitter follower action of transistor 54A and resistor 53A. The voltage drop of resistor 55A by current I4 causes an emitter follower circuit consisting of transistor 56A and resistor 57A to flow current I2 to the collector of transistor 56A.

The current I2 flowing to the collector of transistor 56A functions the same as the current I2 flowing to the collector of transistor 12A in FIG. 5. The description of the following action of this embodiment may be therefore omitted.

In this embodiment, it is possible to change the protection level for overcurrent easily by changing the breakdown voltage of zener diode 52A from outside.

The above description was given for the case where the power transistor was an IGBT. However, it could also be applied to a voltage driven device having a transistor action such as a MOSFET.

According to this invention, an overcurrent due to load short-circuiting etc flows in a transistor, this is detected and restricted to a prescribed current and at high speed. If this condition continues for a prescribed time, the current is made zero by putting the drive voltage of the transistor into the OFF condition. Reliable overcurrent protection of the transistor can thereby be achieved.

Also, if the main current flowing in the power transistor is detected by a second transistor, the proportionality relationship in the current limiting region with respect to the main current can be improved. Furthermore, the degrees of freedom of the main circuit layout are increased and overcurrent protection can easily be achieved even when the device is made of large capacity by connecting transistors in parallel. Moreover, reliable overcurrent protection can still be achieved even when transistor temperature rises. And a protective function of even higher reliability can be provided by suppressing the surge voltage produced when an overcurrent is broken.

Furthermore, according to this invention, an automatic control loop is provided whereby, if the current flowing in the power transistor exceeds a prescribed value, the gate voltage is lowered, and the power transistor current is limited. A control circuit is further provided that gradually diminishes the gate voltage by detecting and holding this if this limiting action continues for more than a fixed time and breaks the current in a soft manner. Thus, an overcurrent protection circuit for a power transistor can be provided that makes possible operation with high reliability in a safe operating region wherein current breaking is effected in a soft manner whilst, in this series of operations, holding the gate drive signal, extending the short-circuit withstand time of the transistor, and concurrently lowering the surge voltage.

Obviously, numerous modifications and variations of the present invention are possible in light of the above teachings. It is therefore to be understood that within the scope of the appended claims, the invention may be practiced otherwise than as specifically described herein.

What is claimed is:

1. An overcurrent protection circuit for a power transistor for flowing a main current in response to a gate drive voltage generated by a gate circuit, comprising:

current detection means for detecting said main current flowing in said power transistor to generate a detection voltage corresponding to said main current;

level detection means connected to receive said detection voltage for generating a control current corresponding to a difference between said detection voltage and a prescribed value when said detection voltage exceeds said prescribed value;

current control means connected to receive said control current for limiting said main current by regulating said gate drive voltage based on said control current; and drive instruction control means connected to receive said control current for making said main current zero by controlling said gate drive voltage to an OFF condition based on said control current.

2. The overcurrent protection circuit according to claim 1, wherein;

said level detection means generates said control current, a value of which being proportional to said difference;

said current control means bypasses said control current from said gate circuit to said level detection means so as to limit said main current by lowering said gate drive voltage; and said current control means further includes a stabilization circuit for delaying a time when said main current is limited by lowering said gate drive voltage;

said stabilization circuit including a series circuit of a resistor and a capacitor.

3. The overcurrent protection circuit according to claim 1, wherein;

said drive instruction control means generates an abnormality signal based on said control current, and makes said main current zero by controlling said gate drive voltage to said OFF condition at a predetermined time after said abnormality signal is generated.

4. The overcurrent protection circuit according to claim 1, wherein:

said current detection means includes a resistor and a voltage-driven-type transistor, a gate and a collector thereof being connected to a gate and a collector of said power transistor, respectively, and said resistor being connected to an emitter of said voltage-driven-type transistor, and generates said detection voltage at said emitter of said voltage-driven-type transistor.

5. The overcurrent protection circuit according to claim 4, wherein:

in said current detection means a threshold voltage of said gate of said voltage-driven-type transistor is set lower than a threshold voltage of said gate of said power transistor.

6. The overcurrent protection circuit according to claim 4, wherein:

said level detection means includes a transistor, a base of which being connected to receive said detection voltage; and in said level detection means said prescribed value corresponds to a threshold voltage of a base of said transistor.

7. The overcurrent protection circuit according to claim 1, wherein:

said current detection means and said level detection means are accommodated along with said power transistor in a single package.

8. The overcurrent protection circuit according to claim 1, wherein:

in said level detection means, said prescribed value is determined to be lowered in response to a temperature of said power transistor.

9. The overcurrent protection circuit according to claim 1, further comprising:

current breaking means connected to receive said control current for making said main current zero by gradually lowering said gate drive voltage when said control current continues to be generated for a prescribed time.

10. The overcurrent protection circuit according to claim 1, wherein the drive instruction control means further comprises:

a timer for commencing time-counting when said detection value exceeds said prescribed value and making said main current zero by controlling said gate drive voltage to an OFF condition after a period of time elapses.

11. The overcurrent protection circuit according to claim 1, wherein the current control means maintains the main current as a steady-state current when said main current exceeds a predetermined value.

12. An overcurrent protection circuit for a power transistor for flowing a main current in response to a gate drive voltage generated by a gate circuit, comprising:

current detection means for detecting said main current flowing in said power transistor to generate a detection voltage corresponding to said main current;

level detection means connected to receive said detection voltage for generating a control current corresponding to a difference between said detection voltage and a prescribed value when said detection voltage exceeds said prescribed value;

current control means for bypassing said control current from said gate circuit to said level detection means so as to limit said main current by lowering said gate drive voltage;

forcible turn-off means for closing and self-holding itself when said control current continues for a prescribed time, for branching said control current progressively therein and for lowering said gate drive voltage forcibly to turn said power transistor off;

wherein said gate drive voltage being controlled, firstly by said current control means, then by said current control means and said forcible turn-off means such that said control current flowing to said level detection means decreases whereas a current branching in said forcible turn-off means increases, and finally by said forcible turn-off means to break said main current in a soft manner.

13. The overcurrent protection circuit according to claim 12, further comprising:

drive instruction control means connected to receive a drive instruction for said power transistor and said control current for holding a condition of said drive instruction when said control current is received and for putting said drive instruction in OFF condition when said control current continued for a fixed time.

14. The overcurrent protection circuit according to claim 13, wherein:

said forcible turn-off means is connected to said drive instruction control means such that said self-holding of said forcible turn-off means is reset by said drive instruction of OFF condition.

15. The overcurrent protection circuit according to claim 12, wherein:

said level detection means generates said control current, a value of which being proportional to said difference.

16. The overcurrent protection circuit according to claim 12, wherein:

said current detection means includes a resistor and a voltage-driven-type transistor, a gate and a collector thereof being connected to a gate and a collector of said power transistor, respectively, and said resistor being connected to an emitter of said voltage-driven-type transistor, and generates said detection voltage at said emitter of said voltage-driven-type transistor.

17. The overcurrent protection circuit according to claim 16, wherein:

said level detection means includes a transistor, a base of which being connected to receive said detection voltage; and in said level detection means said prescribed value corresponds to a threshold voltage of a base of said transistor.

18. The overcurrent protection circuit according to claim 12, wherein:

said current detection means includes a series circuit of a resistor and a diode, and a voltage-driven-type transistor, a gate and a collector thereof being connected to a gate and a collector of said power transistor, respectively, and said series circuit being connected to an emitter of said voltage-driven-type transistor, and generates said detection voltage at said emitter of said voltage-driven-type transistor.

19. The overcurrent protection circuit according to claim 18, wherein:

said level detection means includes a transistor, a base of which being connected to receive said detection voltage; and in said level detection means said prescribed value corresponds to a threshold voltage of a base of said transistor.

20. The overcurrent protection circuit according to claim 12, wherein:

said current detection means and said level detection means are accommodated along with said power transistor in a single package.

21. The overcurrent protection circuit according to claim 12, wherein:

in said level detection means, said prescribed value is determined to be lowered in response to a temperature of said power transistor.

22. The overcurrent protection circuit according to claim 12, wherein:

said level detection means includes a transistor and a zener diode connected in series with an emitter of said transistor, a base of said transistor being connected to receive said detection voltage; and in said level detection means said prescribed value corresponds to a threshold voltage of a base of said transistor and a breakdown voltage of said zener diode.

* * * * *